(12) United States Patent
Kim

(10) Patent No.: US 11,799,365 B2
(45) Date of Patent: *Oct. 24, 2023

(54) SENSING APPARATUS, ROTOR, AND METHOD FOR DETERMINING PRESENCE OF ABNORMALITY IN SENSOR

(71) Applicant: LG INNOTEK CO., LTD., Seoul (KR)

(72) Inventor: Won Kyu Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,858

(22) Filed: Aug. 9, 2022

(65) Prior Publication Data

US 2022/0383724 A1    Dec. 1, 2022

Related U.S. Application Data

(63) Continuation of application No. 16/955,484, filed as application No. PCT/KR2018/016107 on Dec. 18, 2018, now Pat. No. 11,462,972.

(30) Foreign Application Priority Data

Dec. 19, 2017    (KR) .......................... 10-2017-0175103

(51) Int. Cl.
   *G01B 7/30*     (2006.01)
   *H02K 11/215*   (2016.01)
   (Continued)

(52) U.S. Cl.
   CPC ........... *H02K 11/215* (2016.01); *G01D 5/145* (2013.01); *G01R 31/343* (2013.01); *G08B 21/182* (2013.01)

(58) Field of Classification Search
   CPC .......... G01D 5/14; G01D 5/145; G01D 5/147; G01D 5/202; G01D 5/206; G01D 5/225;
   (Continued)

(56) References Cited

U.S. PATENT DOCUMENTS 8,933,692 B2    1/2015  Ueda et al.
9,906,185 B2    2/2018  Dumas
(Continued)

FOREIGN PATENT DOCUMENTS

CN    102667413 A    9/2012
CN    103438920 A    12/2013
(Continued)

*Primary Examiner* — Thang X Le
(74) *Attorney, Agent, or Firm* — Birch, Stewart, Kolasch & Birch, LLP

(57) ABSTRACT

A sensing apparatus includes a first sensor unit including a first hall sensor and a second hall sensor, wherein the first hall sensor outputs two first output values having different phases from each other, and the second hall sensor outputs two second output values having different phases from each other; a second sensor unit outputs a third position detection value of a rotor; and a control unit that compares a first position detection value of the rotor, which is on the basis of the first output values, with a second position detection value of the rotor, which is on the basis of the second output values, and compares at least one of the first position detection value of the rotor and the second position detection value of the rotor, with the third position detection value of the rotor outputted from the second sensor unit.

12 Claims, 8 Drawing Sheets

(51) Int. Cl.
  *G01D 5/14* (2006.01)
  *G01R 31/34* (2020.01)
  *G08B 21/18* (2006.01)

(58) Field of Classification Search
  CPC .......... G01D 5/2208; G01D 5/12; G01D 5/16; G01D 5/2457; G01D 5/24461; G01D 5/24466; G01D 5/2013; G01D 5/2046; G01R 33/0206; G01R 33/06; G01R 33/063; G01R 33/09; G01R 33/093; G01R 33/0052; G01R 33/18; G01R 31/28; G01R 31/34; G01R 31/343; G01B 7/30; G01B 7/003; G01B 7/14; G01P 3/443; G01P 3/488; G01P 3/487; G01P 3/481; G01P 3/685
  See application file for complete search history.

(56) References Cited

U.S. PATENT DOCUMENTS

| | | |
|---|---|---|
| 2011/0246133 A1 | 10/2011 | Harada et al. |
| 2012/0158340 A1 | 6/2012 | Ueda |
| 2012/0182009 A1* | 7/2012 | Ueda .................. G01D 5/145 324/207.25 |
| 2014/0130612 A1 | 5/2014 | Takahashi et al. |
| 2015/0066426 A1* | 3/2015 | Hirota .................. G01D 5/145 702/151 |
| 2015/0077093 A1* | 3/2015 | Saito .................. G01D 5/24466 324/207.13 |
| 2015/0123589 A1 | 5/2015 | Matsutani |
| 2016/0178397 A1 | 6/2016 | Jost et al. |
| 2018/0231400 A1* | 8/2018 | Okumura .............. G01D 5/2454 |
| 2018/0274898 A1* | 9/2018 | Uchida .................. G01D 5/16 |
| 2019/0039645 A1* | 2/2019 | Kuwahara .............. G01D 5/244 |

FOREIGN PATENT DOCUMENTS

| | | |
|---|---|---|
| CN | 105716632 A | 6/2016 |
| JP | 2016-151499 A | 8/2016 |
| KR | 10-2012-0137897 A | 12/2012 |
| KR | 10-2014-0063403 A | 5/2014 |
| KR | 10-2017-0054085 A | 5/2017 |
| KR | 10-2017-0064430 A | 6/2017 |
| KR | 10-2017-0096845 A | 8/2017 |
| WO | WO 2016/132773 A1 | 8/2016 |

* cited by examiner

[FIG. 1]
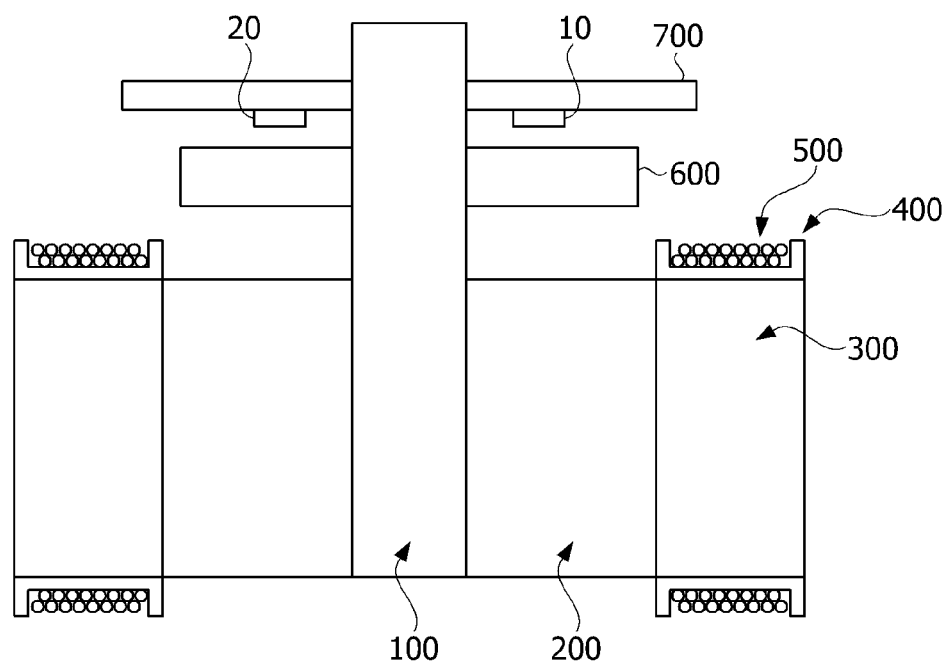

[FIG. 2]
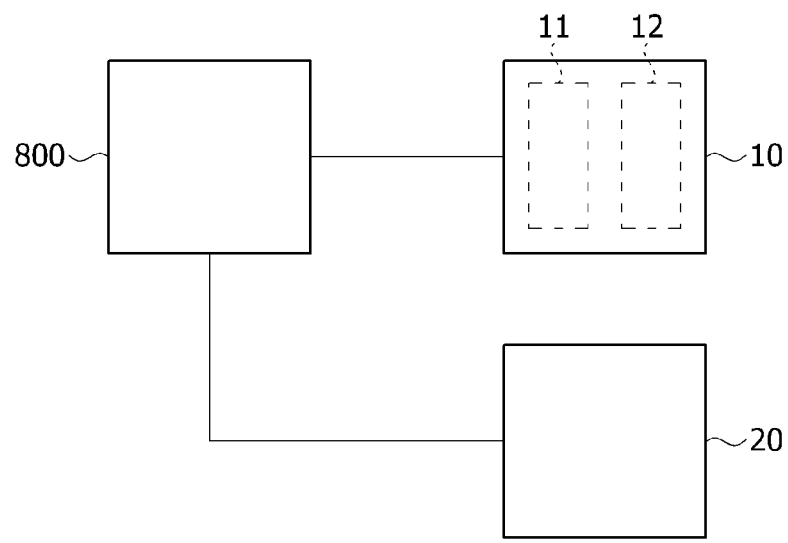

[FIG. 3]
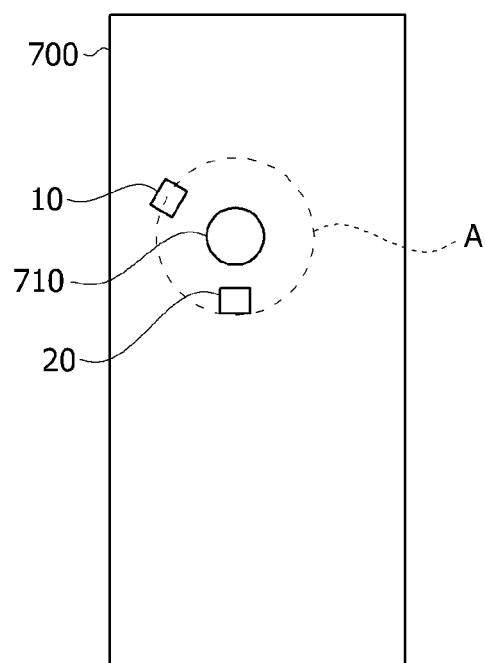

[FIG. 4]
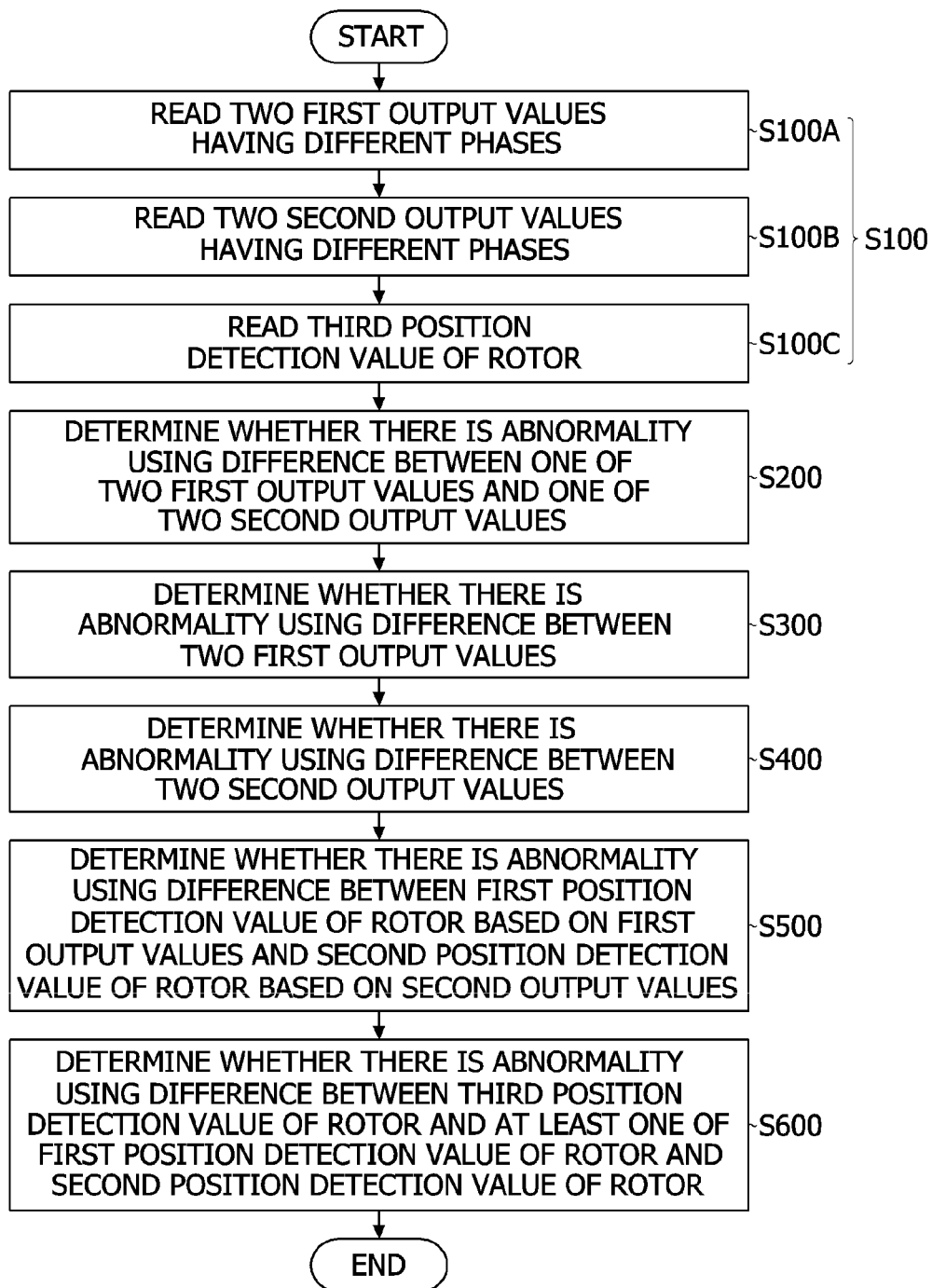

[FIG. 5]
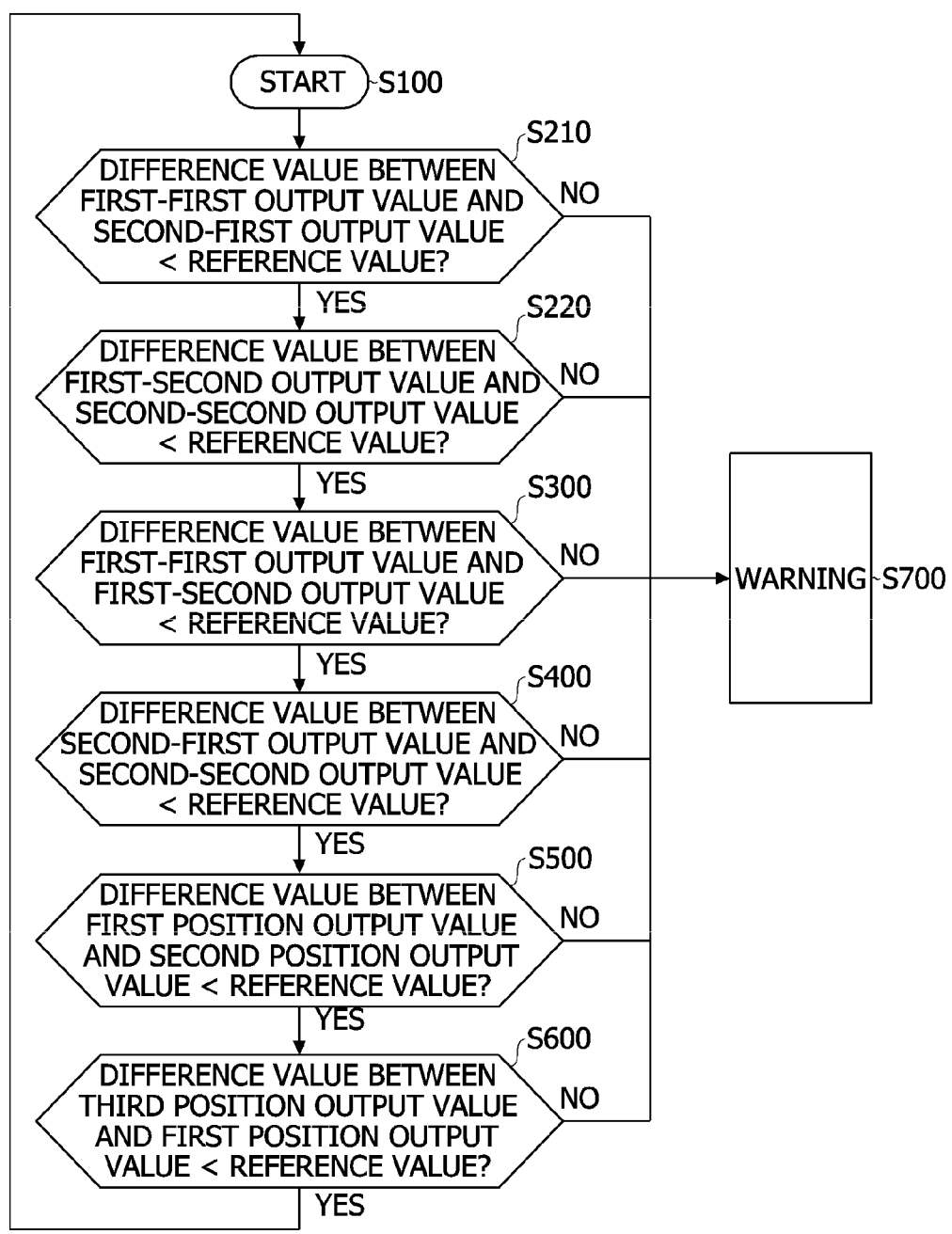

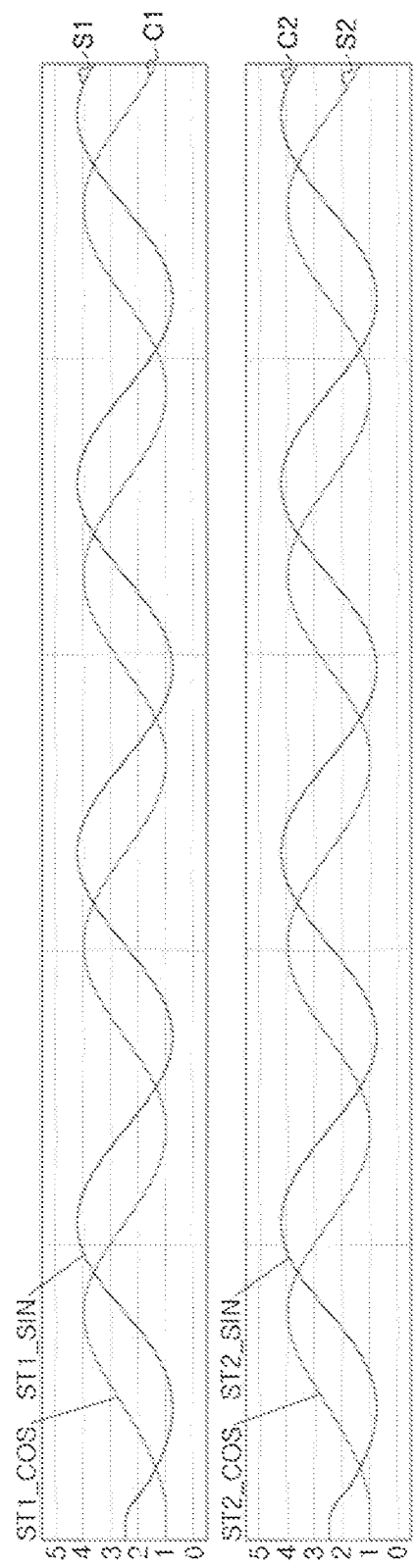
[FIG. 6]

[FIG. 7]
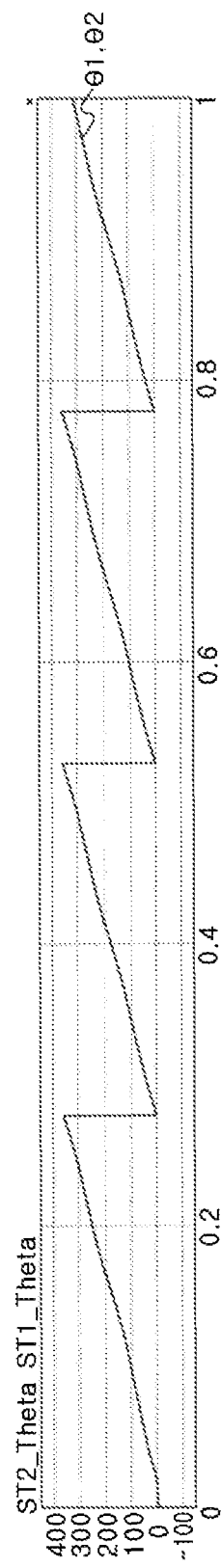

[FIG. 8]
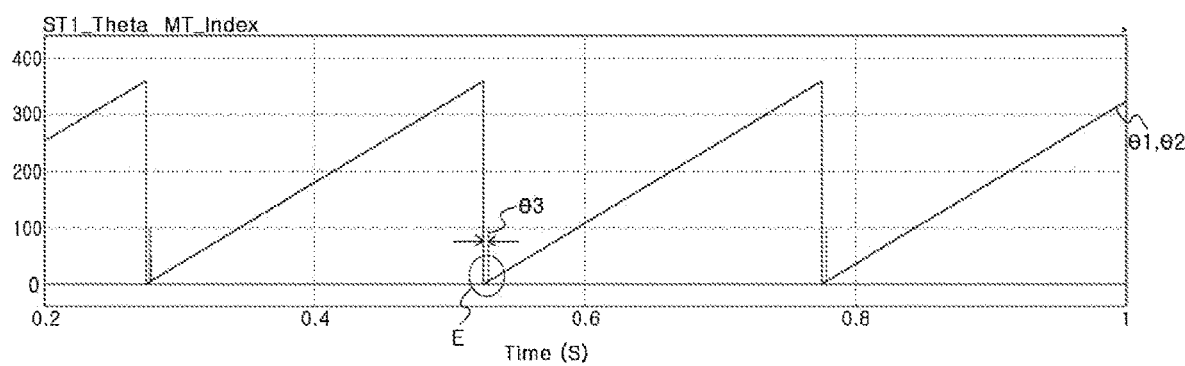

SENSING APPARATUS, ROTOR, AND METHOD FOR DETERMINING PRESENCE OF ABNORMALITY IN SENSOR

CROSS REFERENCE TO RELATED APPLICATIONS

This application is Continuation Application of U.S. application Ser. No. 16/955,484, filed Jun. 18, 2020, which is the National Phase of PCT/KR2018/016107 filed on Dec. 18, 2018, which claims priority under 35 U.S.C. § 119(a) to Patent Application No. 10-2017-0175103 filed in the Republic of Korea on Dec. 19, 2017, all of which are hereby expressly incorporated by reference into the present application.

TECHNICAL FIELD

The present invention relates to a sensing apparatus and a method for determining whether a rotor and a sensor are abnormal.

BACKGROUND ART

A transmission of a vehicle is a transmission apparatus which is manually operated according to a user's clutch operation or automatically operated according to speed. The transmission of a vehicle includes a motor.

The motor of the transmission may include a sensing magnet installed above a rotor. The sensing magnet is formed in a ring shape which has an external circumferential surface and an internal circumferential surface. The sensing magnet is installed above the rotor. Also, a circuit board is disposed above the rotor. A sensor unit is disposed on the circuit board. The sensor unit is disposed to face the sensing magnet and detects the position of the rotor by sensing a change in magnetic flux caused by the rotating sensing magnet.

Meanwhile, when an abnormality occurs in the sensor unit, it is not possible to accurately sense the position of the rotor. Although it is possible to sense whether the position of the rotor is abnormal, it is difficult to determine whether the sensor unit is abnormal. To determine whether the sensor unit is abnormal, it is necessary to additionally install several sensor units. However, this complicates the manufacturing process and leads to an increase in the manufacturing cost.

DISCLOSURE

Technical Problem

Embodiments of the present invention are directed to providing a sensing apparatus and a method for determining whether a rotor and a sensor are abnormal.

Objects to be solved by embodiments of the present invention are not limited to those mentioned above, and other objects which are not mentioned above will be clearly understood by those of ordinary skill in the art from the following description.

Technical Solution

One aspect of the present invention provides a sensing apparatus including a first sensor unit including a first Hall sensor and a second Hall sensor, a second sensor unit, and a control unit connected to the first sensor unit and the second sensor unit. The first Hall sensor outputs two first output values having different phases, and the second Hall sensor outputs two second output values having different phases. The second sensor unit outputs a third position detection value of a rotor, and the control unit compares one of the two first output values with one of the two second output values, compares the two first output values with each other, compares the two second output values with each other, compares a first position detection value of the rotor based on the first output values with a second position detection value of the rotor based on the second output values, and compares at least one of the first position detection value of the rotor and the second position detection value of the rotor with the third position detection value of the rotor output from the second sensor unit to determine whether the rotor and the sensors are abnormal.

The first output values may include a first-first output value ($S1$) and a first-second output value ($C1$), and the first-first output value and the first-second output value may have a phase difference of 90°.

The second output values may include a second-first output value ($S2$) and a second-second output value ($C2$), and the second-first output value and the second-second output value may have a phase difference of 90°.

The control unit may generate a warning signal in at least one of a case in which a difference value between the first-first output value and the first-second output value exceeds a first reference value, a case in which a difference value between the second-first output value and the second-second output value exceeds the first reference value, a case in which a difference value between the first-first output value and the second-first output value exceeds the first reference value, and a case in which a difference value between the first-second output value and the second-second output value exceeds the first reference value.

The first position detection value may be $\arctan(S1/C1)$, the second position detection value may be $\arctan(S2/C2)$, and the control unit may generate a warning signal when a difference value between the first position detection value and the second position detection value exceeds a second reference value.

The control unit may generate a warning signal when a difference value between the first position detection value and the third position detection value exceeds a second reference value.

The control unit may generate a warning signal when a difference value between the second position detection value and the third position detection value exceeds a second reference value.

Another aspect of the present invention provides a method of determining whether a rotor and a sensor are abnormal, the method including reading two first output values having different phases, reading two second output values having different phases, reading a third position detection value of a rotor, determining whether there is an abnormality using a difference value between one of the two first output values and one of the two second output values, determining whether there is an abnormality using a difference value between the two first output values, determining whether there is an abnormality using a difference value between the two second output values, determining whether there is an abnormality using a difference value between a first position detection value of the rotor based on the first output values and a second position detection value of the rotor based on the second output values, and determining whether there is an abnormality using a difference value between at least one of the first position detection value of the rotor and the second position detection value of the rotor and the third position detection value of the rotor output from a second sensor unit.

The first output values may include a first-first output value and a first-second output value, and the first-first output value and the first-second output value may have a phase difference of 90°. The second output values may include a second-first output value and a second-second output value, and the second-first output value and the second-second output value may have a phase difference of 90°.

The method may further include generating a warning signal in at least one of a case in which a difference value between the first-first output value and the first-second output value exceeds a first reference value, a case in which a difference value between the second-first output value and the second-second output value exceeds the first reference value, a case in which a difference value between the first-first output value and the second-first output value exceeds the first reference value, and a case in which a difference value between the first-second output value and the second-second output value exceeds the first reference value.

Advantageous Effects

Embodiments of the present invention provide an advantageous effect that it is possible to sense whether a sensor unit is abnormal without adding an additional part.

DESCRIPTION OF DRAWINGS

FIG. 1 is a diagram of a motor including a sensing apparatus according to an embodiment.

FIG. 2 is a diagram of a control unit and a first sensor unit and a second sensor unit connected to the control unit in the sensing apparatus according to the embodiment.

FIG. 3 is a diagram of the first sensor unit and the second sensor unit mounted on a circuit board.

FIG. 4 is a block diagram illustrating a method of determining whether a rotor and a sensor are abnormal according to an embodiment.

FIG. 5 is a flowchart showing the method of determining whether a rotor and a sensor are abnormal according to the embodiment shown in FIG. 4.

FIG. 6 is a set of graphs showing waveforms of first output values and second output values.

FIG. 7 is a graph illustrating a first position detection value and a second position detection value.

FIG. 8 is a graph illustrating a first position detection value, a second position detection value, and a third position detection value.

MODES OF THE INVENTION

Hereinafter, exemplary embodiments of the present invention will be described in detail with reference to the accompanying drawings. Objects, specific advantages, and novel features of the invention should become clear from the exemplary embodiments and the following detailed description related to the accompanying drawings. Terms and words used in this specification and claims are not to be interpreted as being limited to commonly used meanings or meanings in dictionaries and should be interpreted as having meanings and concepts which are consistent with the technological spirit of the invention on the basis of the principle that the inventor has appropriately defined concepts of the terms in order to describe the invention in the best way. In describing the present invention, the detailed description of related well-known technology which may obscure the gist of the invention will be omitted.

Terms including ordinal numbers, such as second and first, may be used to describe various elements, but the elements are not limited by the terms. The terms are only used to distinguish one element from another. For example, without departing from the scope of the present invention, a second element may be referred to as a first element, and similarly, a first element may be referred to as a second element. The term "and/or" includes a combination of a plurality of associated listed items or any one of the plurality of associated listed items.

FIG. 1 is a diagram of a motor including a sensing apparatus according to an embodiment.

Referring to FIG. 1, the motor may include a shaft 100, a rotor 200, and a stator 300.

The rotor 200 and the stator 300 have electrical interaction with each other. When mutual electrical interaction is caused, the rotor 200 rotates, and the shaft 100 rotates in conjunction with the rotor 200. The shaft 100 may be connected to a dual-clutch transmission (DCT) to provide power.

Unlike a single-clutch transmission which is installed in a conventional manual transmission vehicle, the DCT includes two clutches. The DCT is a system in which the first, third, and fifth stages are implemented by power transferred through one clutch and the second, fourth, and sixth stages are implemented by power transferred through the other clutch.

The DCT may selectively receive power of the shaft 100.

The DCT may provide high drivability and smooth feeling of transmission like a conventional automatic transmission vehicle and exhibit higher fuel efficiency than a conventional manual transmission vehicle.

The stator 300 may include a stator core including a plurality of teeth. In the stator core, a circular yoke portion may be provided, and in the yoke, the teeth around which a coil is wound with respect to the center of the teeth may be provided. The teeth may be provided at regular intervals on the external circumferential surface of the yoke portion. Meanwhile, the stator core may be formed by stacking a plurality of plates which are thin steel sheets. Also, the stator core may be formed by coupling or connecting a plurality of division cores to each other.

An insulator 400 may be wound around the teeth of the stator 300.

A coil 500 is wound on the insulator 400. The coil 500 has electrical interaction with the rotor 200.

A sensing magnet 600 is a device which is coupled to the shaft 100 to operate in conjunction with the rotor 200 and which is for the purpose of detecting the position of the rotor 200.

A sensing apparatus according to the embodiment may be provided on a circuit board 700. The sensing apparatus may include a first sensor unit 10 and a second sensor unit 20 which sense the magnetic force of the sensing magnet 600. The first sensor unit 10 and the second sensor unit 20 sense a change of an N pole and an S pole of the sensing magnet 600 and generate a sensing signal.

FIG. 2 is a diagram of a control unit and a first sensor unit and a second sensor unit connected to the control unit in the sensing apparatus according to the embodiment, and FIG. 3 is a diagram of the first sensor unit and the second sensor unit mounted on a circuit board.

Referring to FIGS. 2 and 3, a control unit 800 may be mounted on a circuit board 700. The control unit 800 is connected to the first sensor unit 10 and the second sensor unit 20. A hole 710 through which the shaft 100 passes may be provided in the circuit board 700. The first sensor unit 10 and the second sensor unit 20 may be disposed around the hole 710. A dotted line A of FIG. 3 denotes a boundary which represents the external circumferential surface of the sensing magnet 600, and the first sensor unit 10 and the second sensor unit 20 may be disposed along the dotted line A of FIG. 3. The first sensor unit 10 and the second sensor unit 20 may be disposed adjacent to the dotted line A of FIG. 3.

The first sensor unit 10 is for the purpose of detecting the position of the rotor 200. The first sensor unit 10 may be a dual type sensor which includes a first Hall sensor 11 and a second Hall sensor 12 in one chip.

The first Hall sensor 11 outputs two first output values having different phases. The two first output phases having different phases are referred to as a first-first output value and a first-second output value. The first-first output value and the first-second output value may have a phase difference of 90°. The first-first output value S1 (see FIG. 6) may be an output value of a sine wave, and the first-second output value C1 (see FIG. 6) may be an output value of a cosine wave. The control unit 800 may detect a first position detection value θ1 (see FIG. 7) of the rotor 200, which is a reference for one revolution of the rotor 200, from the first output values. For example, the control unit 800 may calculate the first position detection value θ1 (see FIG. 7) using Equation 1 below.

$$\theta 1 = \arctan(S1/C1) \quad \text{[Equation 1]}$$

Here, θ1 denotes the first position detection value, S1 denotes the first-first output value, and C1 denotes the first-second output value.

The second Hall sensor 12 outputs two second output values having different phases. The two second output phases having different phases are referred to as a second-first output value and a second-second output value. The second-first output value and the second-second output value may have a phase difference of 90°. The second-first output value S2 (see FIG. 6) may be an output value of a sine wave, and the second-second output value C2 (see FIG. 6) may be an output value of a cosine wave. The control unit 800 may detect a second position detection value θ2 (see FIG. 7) of the rotor 200, which is a reference for one revolution of the rotor 200, from the second output values. For example, the control unit 800 may calculate the second position detection value θ2 (see FIG. 7) using Equation 2 below.

$$\theta 2 = \arctan(S2/C2) \quad \text{[Equation 2]}$$

Here, θ2 denotes the second position detection value, S2 denotes the second-first output value, and C2 denotes the second-second output value.

The second sensor unit 20 is for detecting a third position detection value θ3 (see FIG. 7) of the rotor 200 which is a reference for one revolution of the rotor 200. The second sensor unit 20 may generate a pulse at every revolution of the rotor 200, and in this case, the third position detection value θ3 (see FIG. 7) is 360°.

FIG. 4 is a block diagram illustrating a method of determining whether a rotor and a sensor are abnormal according to an embodiment, FIG. 5 is a flowchart showing the method of determining whether a rotor and a sensor are abnormal according to the embodiment shown in FIG. 4, and FIG. 6 is a set of graphs showing the waveforms of first output values and second output values.

Referring to FIGS. 4 to 6, in the method of determining whether a rotor and a sensor are abnormal according to the embodiment, the control unit 800 may first read first output values, second output values, or a third position detection value (S100).

For example, the control unit 800 reads the first-first output value S1 and the first-second output value C1 which have a phase difference of 90° through the first Hall sensor 11 of the first sensor unit 10 (S100A). Also, the control unit 800 reads the second-first output value S2 and the second-second output value C2 which have a phase difference of 90° through the second Hall sensor 12 of the first sensor unit 10 (S100B). Then, the control unit 800 reads a third position detection value through the second sensor unit 20 (S100C).

A process of determining whether an abnormality exists by comparing the first Hall sensor 11 with the second Hall sensor 12 is as follows.

Subsequently, the control unit 800 may determine whether the first sensor unit 10 is abnormal by comparing the first output values with the second output values (S200).

For example, the control unit 800 determines whether the absolute value of a difference value between the first-first output value S1 output from the first Hall sensor 11 and the second-first output value S2 output from the second Hall sensor 12 exceeds a first reference value (e.g., 0.23 V) (S210). Here, the first-first output value S1 and the second-first output value S2 are sine waves having the same phase.

When the difference value between the first-first output value S1 and the second-first output value S2 exceeds the first reference value, the control unit 800 determines that the first sensor unit 10 is abnormal and generates a warning signal (S700).

When the difference value between the first-first output value S1 and the second-first output value S2 does not exceed the first reference value, the control unit 800 determines whether the absolute value of a difference value between the first-second output value C1 output from the first Hall sensor 11 and the second-second output value C2 output from the second Hall sensor 12 exceeds the first reference value (e.g., 0.23 V) (S220). Here, the first-second output value C1 and the second-second output value C2 are cosine waves having the same phase.

When the difference value between the first-second output value C1 and the second-second output value C2 exceeds the first reference value, the control unit 800 determines that the first sensor unit 10 is abnormal and generates a warning signal (S700).

Meanwhile, when both of the first Hall sensor 11 and the second Hall sensor 12 are abnormal, the first output values and the second output values have errors, but the difference value may be the first reference value or less. Therefore, it is necessary to determine whether each of the first Hall sensor 11 and the second Hall sensor 12 is abnormal.

A process of determining whether the first Hall sensor 11 is abnormal is as follows.

When the difference value between the first-second output value C1 and the second-second output value C2 does not exceed the first reference value, the control unit 800 thereafter determines whether the first Hall sensor 11 is abnormal by comparing the two first output values (S300).

For example, the control unit 800 determines whether the absolute value of a difference value between the first-first output value S1 and the first-second output value C1 output from the first Hall sensor 11 exceeds the first reference value (e.g., 0.23 V). Here, the first-first output value S1 may be the maximum amplitude of the sine wave, and the first-second output value C1 may be the maximum amplitude of the cosine wave. When the difference value between the first-first output value S1 and the first-second output value C1 exceeds the first reference value, the control unit 800 determines that the first Hall sensor 11 is abnormal and generates a warning signal (S700).

A process of determining whether the second Hall sensor 12 is abnormal is as follows.

When the difference value between the first-first output value S1 and the first-second output value C1 does not exceed the first reference value, the control unit 800 determines whether the second Hall sensor 12 is abnormal by comparing the two second output values (S400).

For example, the control unit 800 determines whether the absolute value of a difference value between the second-first output value S2 and the second-second output value C2 output from the second Hall sensor 12 exceeds the first reference value (e.g., 0.23 V). Here, the second-first output value S2 may be the maximum amplitude of the sine wave, and the second-second output value C2 may be the maximum amplitude of the cosine wave. When the difference value between the second-first output value S2 and the second-second output value C2 exceeds the first reference value, the control unit 800 determines that the second Hall sensor 12 is abnormal and generates a warning signal (S700).

When the absolute value of the difference value between the second-first output value S2 and the second-second output value C2 does not exceed the first reference value, the control unit 800 determines whether the first sensor unit 10 is abnormal on the basis of the position of the rotor 200 which is a reference for one revolution of the rotor 200.

FIG. 7 is a graph illustrating a first position detection value and a second position detection value.

The control unit 800 may detect the first position detection value θ1 of the rotor 200 which is a reference for one revolution of the rotor 200 from the first output values. Also, the control unit 800 may detect the second position detection value θ2 of the rotor 200 which is a reference for one revolution of the rotor 200 from the second output values. Since each of the first position detection value θ1 and the second position detection value θ2 represents the position of the rotor 200, the first position detection value θ1 and the second position detection value θ2 may be identical.

The control unit 800 determines whether the absolute value of a difference value between the first position detection value θ1 and the second position detection value θ2 exceeds a second reference value (e.g., 4°) (S500). When the absolute value of the difference value between the first position detection value θ1 and the second position detection value θ2 exceeds the second reference value (e.g., 4°), the control unit 800 determines that the first sensor unit 10 is abnormal and generates a warning signal (S700).

However, when both of the first position detection value θ1 and the second position detection value θ1 have errors, the absolute value of the difference value between the first position detection value θ1 and the second position detection value θ1 may not exceed the second reference value in spite of an abnormality of the first sensor unit 10. Therefore, the control unit 800 additionally determines whether the first sensor unit 10 is abnormal using the third position detection value θ3 of the second sensor unit 20.

FIG. 8 is a graph illustrating a first position detection value, a second position detection value, and a third position detection value.

Referring to FIG. 8, the control unit 800 may detect the third position detection value θ3 which is a reference for one revolution of the rotor 200 through the second sensor unit 20. The control unit 800 determines whether the absolute value of a difference value E (see FIG. 8) between the first position detection value θ1 and the third position detection value θ3 or a difference value E (see FIG. 8) between the second position detection value θ2 and the third position detection value θ3 exceeds the second reference value (e.g., 4°) (S600).

For example, as shown in FIG. 8, when a pulse wave representing the third position detection value θ3 and a sawtooth waveform representing the first position detection value θ1 or the second position detection value θ2 are shown in the same time period, a difference value is obtained at a point at which the position of the rotor 200 is 360° as indicated by the difference value E of FIG. 8. When the difference value exceeds 4°, the control unit 800 may determine that the first Hall sensor 11 is abnormal.

As such, when the absolute value of the difference value between the first position detection value θ1 and the third position detection value θ3 or the difference value between the second position detection value θ2 and the third position detection value θ3 exceeds the second reference value (e.g., 4°), the control unit 800 determines that the first sensor unit 10 is abnormal and generates a warning signal (S700). In this case, even when the absolute value of the difference value between the first position detection value θ1 and the second position detection value θ2 does not exceed the second reference value in spite of an abnormality of the first sensor unit 10, it is possible to detect the abnormality of the first sensor unit 10.

The sensing apparatus and the method for determining whether a rotor and a sensor are abnormal according to one exemplary embodiment of the present invention have been described in detail above with reference to the accompanying drawings.

The above description is just an exemplary description of the technical spirit of the present invention, and various modifications, alterations, and substitutions can be made by those of ordinary skill in the art without departing from essential characteristics of the present invention. Accordingly, the embodiments disclosed in the present invention and the accompanying drawings do not limit but are for describing the technical spirit of the present invention, and the scope of the technical spirit of the present invention is not limited by the embodiments and the accompanying drawings. The scope of the present invention should be interpreted by the following claims, and all technical spirits within the scope equivalent thereto should be interpreted as falling within the scope of the present invention.

The invention claimed is:

1. A sensor apparatus comprising:
   a first sensor unit;
   a second sensor unit; and
   a control unit connected to the first sensor unit and the second sensor unit,
   wherein the first sensor unit includes a first Hall sensor and a second Hall sensor,
   wherein the first Hall sensor outputs two first output values having different phases,
   wherein the second Hall sensor outputs two second output values having different phases,
   wherein the second sensor unit outputs a third position detection value of a rotor, and
   wherein the control unit compares a first position detection value of the rotor based on the first output values with a second position detection value of the rotor based on the second output values, and compares at least one of the first position detection value of the rotor and the second position detection value of the rotor with the third position detection value of the rotor output from the second sensor unit to determine whether the rotor and the sensors are abnormal.

2. The sensor apparatus of claim 1, wherein the first output values include a first-first output value (S1) and a first-second output value (C1), and wherein a phase difference between the first-first output value and the first-second output value is 90°.

3. The sensor apparatus of claim 2, wherein the second output values include a second-first output value (S2) and a second-second output value (C2), and wherein a phase difference between the second-first output value and the second-second output value is 90°.

4. The sensor apparatus of claim 3, wherein the control unit generates a warning signal in at least one of:
   a case in which a difference value between the first-first output value and the first-second output value exceeds a first reference value;
   a case in which a difference value between the second-first output value and the second-second output value exceeds the first reference value;
   a case in which a difference value between the first-first output value and the second-first output value exceeds the first reference value; and
   a case in which a difference value between the first-second output value and the second-second output value exceeds the first reference value.

5. The sensor apparatus of claim 1, wherein the first output values include a first-first output value (S1) and a first-second output value (C1),
   wherein the first position detection value is arctan(S1/C1),
   wherein the second position detection value is arctan(S2/C2), and
   wherein the control unit generates a warning signal when a difference value between the first position detection value and the second position detection value exceeds a second reference value.

6. The sensor apparatus of claim 1, wherein the control unit generates a warning signal when a difference value between the first position detection value and the third position detection value exceeds a second reference value.

7. The sensor apparatus of claim 1, wherein the control unit generates a warning signal when a difference value between the second position detection value and the third position detection value exceeds a second reference value.

8. The sensor apparatus of claim 1, wherein the control unit compares one of the two first output values with one of the two second output values, compares the two first output values with each other, and compares the two second output values with each other.

9. A method of determining whether a rotor and a sensor are abnormal, the method comprising:
   reading two first output values having different phases;
   reading two second output values having different phases;
   reading a third position detection value of a rotor;
   determining whether there is an abnormality using a difference value between a first position detection value of the rotor based on the first output values and a second position detection value of the rotor based on the second output values; and
   determining whether there is an abnormality using a difference value between at least one of the first position detection value of the rotor and the second position detection value of the rotor and the third position detection value of the rotor output from a second sensor unit.

10. The method of claim 9, wherein the first output values include a first-first output value and a first-second output value which have a phase difference of 90°, and
    wherein the second output values include a second-first output value and a second-second output value which have a phase difference of 90°.

11. The method of claim 10, further comprising generating a warning signal in at least one of:
    a case in which a difference value between the first-first output value and the first-second output value exceeds a first reference value;
    a case in which a difference value between the second-first output value and the second-second output value exceeds the first reference value;
    a case in which a difference value between the first-first output value and the second-first output value exceeds the first reference value; and
    a case in which a difference value between the first-second output value and the second-second output value exceeds the first reference value.

12. The method of claim 9, further comprising:
    determining whether there is an abnormality using a difference value between one of the two first output values and one of the two second output values;
    determining whether there is an abnormality using a difference value between the two first output values; and
    determining whether there is an abnormality using a difference value between the two second output values.

* * * * *